United States Patent
Lin et al.

(10) Patent No.: US 10,936,776 B1
(45) Date of Patent: Mar. 2, 2021

(54) ANALYZING WAVEFORM DATA GENERATED FOR SIMULATED CIRCUIT DESIGN

(71) Applicant: Cadence Design Systems, Inc., San Jose, CA (US)

(72) Inventors: Chien-Liang Lin, San Jose, CA (US); Thamara Karen Cunha Andrade, Itauna (BR); Ronalu Augusta Nunes Barcelos, Belo Horizonte (BR); Gabriel Peres Nobre, Belo Horizonte (BR); Igor Tiradentes Murta, Belo Horizonte (BR); Vitor Machado Guilherme Barros, Belo Horizonte (BR); Rafael Sales Medina Ferreira, Belo Horizonte (BR); Marcos Augusto de Goes, Paulínia (BR)

(73) Assignee: Cadence Design Systems, Inc., San Jose, CA (US)

( * ) Notice: Subject to any disclaimer, the term of this patent is extended or adjusted under 35 U.S.C. 154(b) by 0 days.

(21) Appl. No.: 16/834,777

(22) Filed: Mar. 30, 2020

(51) Int. Cl.
*G06F 30/33* (2020.01)
*G06F 30/333* (2020.01)
(Continued)

(52) U.S. Cl.
CPC .............. *G06F 30/333* (2020.01); *G06F 8/71* (2013.01); *G06F 9/30101* (2013.01); *G06F 30/20* (2020.01)

(58) Field of Classification Search
CPC ........ G06F 30/33; G06F 30/331; G06F 30/34; G06F 30/3312; G06F 30/30; G06F 30/398; G06F 11/3466; G06F 11/079; G06F 11/2205; G06F 11/263; G06F 11/3003; G06F 11/3409; G06F 2201/86; G06F 30/367; G06F 2119/12; G06F 11/221; G06F 11/3636; G06F 2119/06; G06F 30/20; G06F 30/3323; G06F 1/04; G06F 11/3652; G06F 2117/08; G06F 30/333; G06F 11/3664; G06F 2111/12; G06F 30/39; G06F 30/394; G06F 11/261; G06F 11/322; G06F 11/323; G06F 11/362; G06F 11/3624; G06F 16/16; G06F 16/211; G06F 16/245; G06F 16/2465; G06F 16/26; G06F 19/321; G06F 2111/02; G06F 2111/04; G06F 2115/08; G06F 2201/80; G06F 30/18; G06F 30/31; G06F 30/3308; G06F 30/337; G06F 30/35; G06F 30/36; G06F 30/373;
(Continued)

(56) References Cited

U.S. PATENT DOCUMENTS

| | | | |
|---|---|---|---|
| 2005/0268265 A1* | 12/2005 | Ly | G06F 30/33 716/108 |
| 2008/0183457 A1* | 7/2008 | Klein | G06F 11/3664 703/14 |
| 2011/0289373 A1* | 11/2011 | Klein | G06F 30/33 714/741 |

* cited by examiner

Primary Examiner — Binh C Tat
(74) Attorney, Agent, or Firm — Schwegman Lundberg & Woessner, P.A.

(57) ABSTRACT

Various embodiments provide for analyzing (e.g., debugging) waveform data generated for a simulated circuit design, which can be used as part of electronic design automation (EDA). For example, where a user modifies a circuit design in a manner that impacts a next simulation run performed on the circuit design, various embodiments perform the next simulation run only on one or more portions of the circuit design affected by the user's modifications, while the results/simulated values for the rest of the circuit design are kept or reused.

20 Claims, 9 Drawing Sheets

(51) Int. Cl.
*G06F 9/30* (2018.01)
*G06F 8/71* (2018.01)
*G06F 30/20* (2020.01)

(58) Field of Classification Search
CPC ............. G06F 3/04842; G06F 3/04847; G06F 3/04897; G06F 7/02; G06F 8/452; G06F 8/48; G06F 8/49; G06F 9/54; G01R 31/3177; G01R 31/2851; G01R 31/30; G01R 31/318314; H03K 19/17728; H03K 19/17736; H03K 19/17748; Y02D 10/00; G11C 11/412; G11C 11/418; G11C 2207/002; G06K 9/00973
USPC ...................................... 716/50–56, 100–109
See application file for complete search history.

ANALYZING WAVEFORM DATA GENERATED FOR SIMULATED CIRCUIT DESIGN

TECHNICAL FIELD

Embodiments described herein relate to circuit design and, more particularly, to systems, methods, devices, and instructions for analyzing waveform data generated for a simulated circuit design, which can be used as part of electronic design automation (EDA) and used to debug a problem in a circuit design.

BACKGROUND

Modem electronic design is typically performed with computer-aided design (CAD) tools or EDA systems. To design an integrated circuit (IC) device, a designer first creates high-level behavior descriptions of the IC device using a high-level hardware design language (HDL). Common examples of HDLs include Verilog and VHDL. An EDA system typically receives the high-level behavioral descriptions of the IC device and translates this high-level design language into netlists of various levels of abstraction. Essentially, the process to implement an electronic device begins with functional design and verification (e.g., using register transfer level (RTL)), and then proceeds to physical design of a circuit design layout and verification.

During development of a circuit design, a circuit designer can use different methods to identify one or more problems (e.g., incorrect output, issues, errors, bugs, etc.) present in the circuit design. One common method is to analyze (e.g., debug) waveform data generated by simulating operation of the circuit design, where the waveform data can represent one or more signals generated by one or more components of the simulated circuit design. By analyzing the waveform data, the circuit designer can monitor behaviors of the circuit design with respect to test stimuli (e.g., one or more test signal inputs). For example, the circuit designer can analyze the waveform data (e.g., as graphically presented to the circuit designer via a graphical user interface of an EDA), and can identify a problem in the circuit design based on the analysis. Generally, when waveform data describing a problem is identified, the circuit designer can manually change the circuit design (e.g., to attempt to resolve the problem), and can determine if the problem is resolved by the manual change. Additionally, to debug a problem in a HDL for a circuit design, a user can usually change the RTL data for the circuit design and resynthesize the circuit design based on the changed RTL data (or can apply abstractions that correct the behavior of the circuit design), and afterwards the simulation can be performed to determine if the problem is fixed. This process can be repeated several times (as the root cause of the problem might not be the changed RTL/applied abstraction). Unfortunately, identifying and resolving circuit design problems by traditional approaches is often costly and time consuming, which can create a substantial bottleneck during circuit design development (e.g., bottleneck during the circuit design verification).

BRIEF DESCRIPTION OF THE DRAWINGS

Various ones of the appended drawings merely illustrate various embodiments of the present disclosure and should not be considered as limiting its scope.

DETAILED DESCRIPTION

Figure 1:
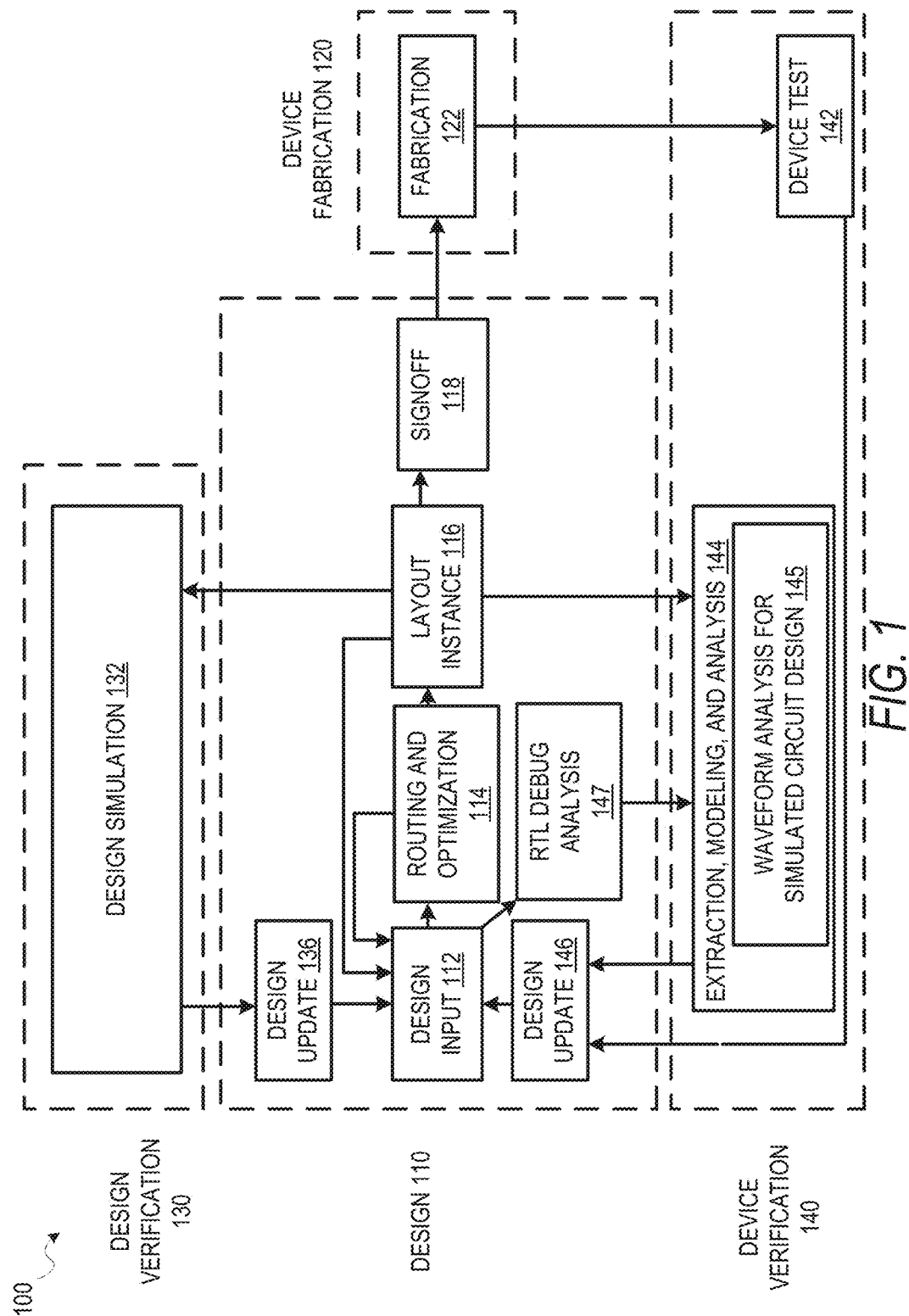
FIG. 1 is a diagram illustrating an example design process flow for analyzing waveform data generated for simulated circuit design, according to some embodiments.

Various embodiments provide for analyzing waveform data generated for a simulated circuit design, which can be used as part of EDA and to debug a circuit design. In particular, some embodiments described herein facilitate an approach for debugging waveform data for a simulated circuit design that comprises fast simulation cycles through the debug cycle, which can reduce overall turnaround time between identifying and resolving a problem (e.g., error, issue, incorrect result, or bug) within the circuit design (e.g., all through a graphical user interface, such as one associated with an EDA). After a user (e.g., circuit design engineer) reviews waveform data generated by performing a full simulation (of operation) of a circuit design and implements modifications (e.g., inserts additional logic) to the circuit design, various embodiments can provide RTL change data for the modified circuit design and can enable re-simulation (of operation) of the modified circuit design using the minimum number of signals, which can facilitate display of relevant information regarding circuit design modifications.

For some embodiments, while debugging a circuit design based on associated waveform data, the user can be shown a graphical user interface to facilitate the user's changes to the circuit design logic for the purpose of simulation. Various embodiments display one or more annotations (e.g., visual aids, such as highlights) on the graphical user interface, which can indicate to a user (e.g., differentiate) which portions of the circuit design are simulated again based on a circuit design modification, and which portions of the circuit design are not simulated again. For those portions of the circuit design that are not simulated again, the results/simulated values (e.g., signal values) from a prior simulation run can be kept or reused. In this way, where a user modifies a circuit design in a manner that impacts a next simulation run performed on the circuit design, various embodiments perform the next simulation run only on one or more portions of the circuit design affected by the user's modification, while the results/simulated values for the rest of the circuit design are kept or reused. As a result, the next simulation run can be performed faster than performing a full simulation of the circuit design. By some embodiments, a preview of changed values (e.g., changed signal values) is generated and displayed (e.g., during a debug cycle) based on the circuit design modifications prior to performing the next simulation run. Eventually, some embodiments export all user modifications into RTL data, which can enable a user to easily apply the changes to an RTL file describing an original version of the circuit design.

Reference will now be made in detail to embodiments of the present disclosure, examples of which are illustrated in the appended drawings. The present disclosure may, however, be embodied in many different forms and should not be construed as being limited to the embodiments set forth herein.

FIG. 1 is a diagram illustrating an example design process flow 100 for analyzing waveform data generated for simulated circuit design, according to some embodiments. As shown, the design process flow 100 includes a design phase 110, a device fabrication phase 120, a design verification phase 130, and a device verification phase 140. The design phase 110 involves an initial design input 112 operation where the basic elements and functionality of a device are determined, as well as revisions based on various analyses and optimization of a circuit design. This design input 112 operation is where block instances are used in the circuit design and any additional circuitry for the design around the blocks is selected. The initial strategy, tactics, and context for the device to be created are also generated in the design input 112 operation, depending on the particular design algorithm to be used.

In some embodiments, following an initial selection of design values in the design input 112 operation, routing, timing analysis, and optimization are performed in a routing and optimization 114 operation, along with any other automated design processes. Though not shown, the routing and optimization 114 operation can include a clock tree synthesis (CTS) operation, which can generate one or more clock trees that deliver a clock signal from clock sources of a circuit design to a plurality of clock tree leaf nodes comprising clock tree pins (e.g., of circuit devices, such as flip-flops) within the circuit design. The routing and optimization 114 operation may also include other operations not shown, such as those relating to floorplanning, placement, post-placement optimization, and post-routing optimization.

While the design process flow 100 shows optimization occurring prior to a layout instance 116, timing analysis and optimization may be performed at any time to verify operation of a circuit design. For instance, in various embodiments, timing analysis in a circuit design may be performed prior to routing of connections in the circuit design, after routing, during RTL operations, or as part of a signoff 118, as described below.

Design inputs are used in the design input 112 operation to generate an initial circuit layout. The design inputs may be further processed during the design input 112 operation via a process, such as logic-synthesis, to generate a circuit netlist mapped to a target standard library manufacturable by the foundry in fabrication 122 operation. After design inputs are used in the design input 112 operation to generate an initial circuit layout, and any of the routing and optimization 114 operations are performed, a resulting layout is generated as the layout instance 116. The netlist as placed by the layout instance 116 describes the physical layout dimensions of the device that match the design inputs. Prior to this layout being provided to a fabrication 122 operation, the signoff 118 is performed on the circuit design defined by the layout.

After signoff verification by the signoff 118, a verified version of the layout is used in the fabrication 122 operation to generate a device, or additional testing and design updates may be performed using designer inputs or automated updates based on design simulation 132 operations or analysis 144 operations. Once the device is generated, the device can be tested as part of device test 142 operations, and layout modifications generated based on actual device performance.

As described in more detail below, a design update 136 from the design simulation 132; a design update 146 from the device test 142 or the analysis 144 operations; or the design input 112 operation may occur after the initial layout instance 116 is generated. In various embodiments, whenever design inputs are used to update or change an aspect of a circuit design, a timing analysis and the routing and optimization 114 operation may be performed.

As shown, the analysis 144 operation includes an operation 145 for waveform analysis for simulated circuit design, which may be performed in accordance with various embodiments described herein. For some embodiments, operation 145 can be performed as part of a debugging or analysis process or function used on a circuit design (e.g., via a graphical user interface of an EDA).

For some embodiments, design 110 phase includes a RTL debug analysis 147 operation after the design input 112, where the RTL debug analysis 147 operation allows debugging of high level RTL logics (e.g., that maps to RTL code) produced by design input 112 operation. From the RTL debug analysis 147, the design phase 110 can proceed to analysis 144 operation and, more specifically, to operation 145 for waveform analysis for simulated circuit design as described herein. In this way, various embodiments can facilitate high level RTL debug analysis cycles of a circuit design, where high level RTL debug analysis cycles permit waveform analysis to occur much sooner during a design cycle of a circuit design, and avoid the penalty of timing analysis and routing costs that would be otherwise incurred to perform the waveform analysis (e.g., during gate level RTL analysis facilitated by the 144 operation via the 114 and 116 operations).

Figure 2:
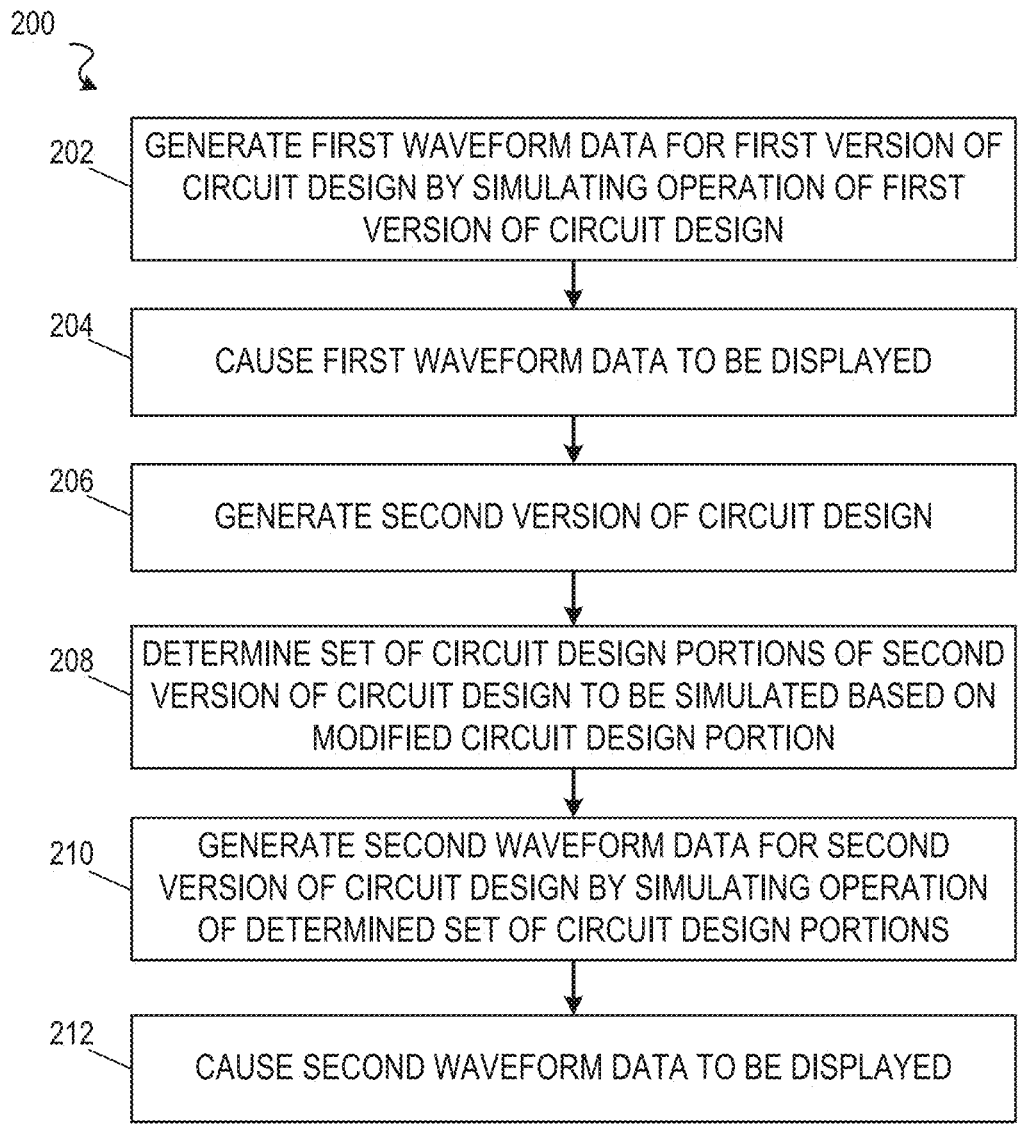
FIGS. 2 and 3 are flowcharts illustrating example methods for analyzing waveform data generated for simulated circuit design, according to some embodiments.
Figure 3:
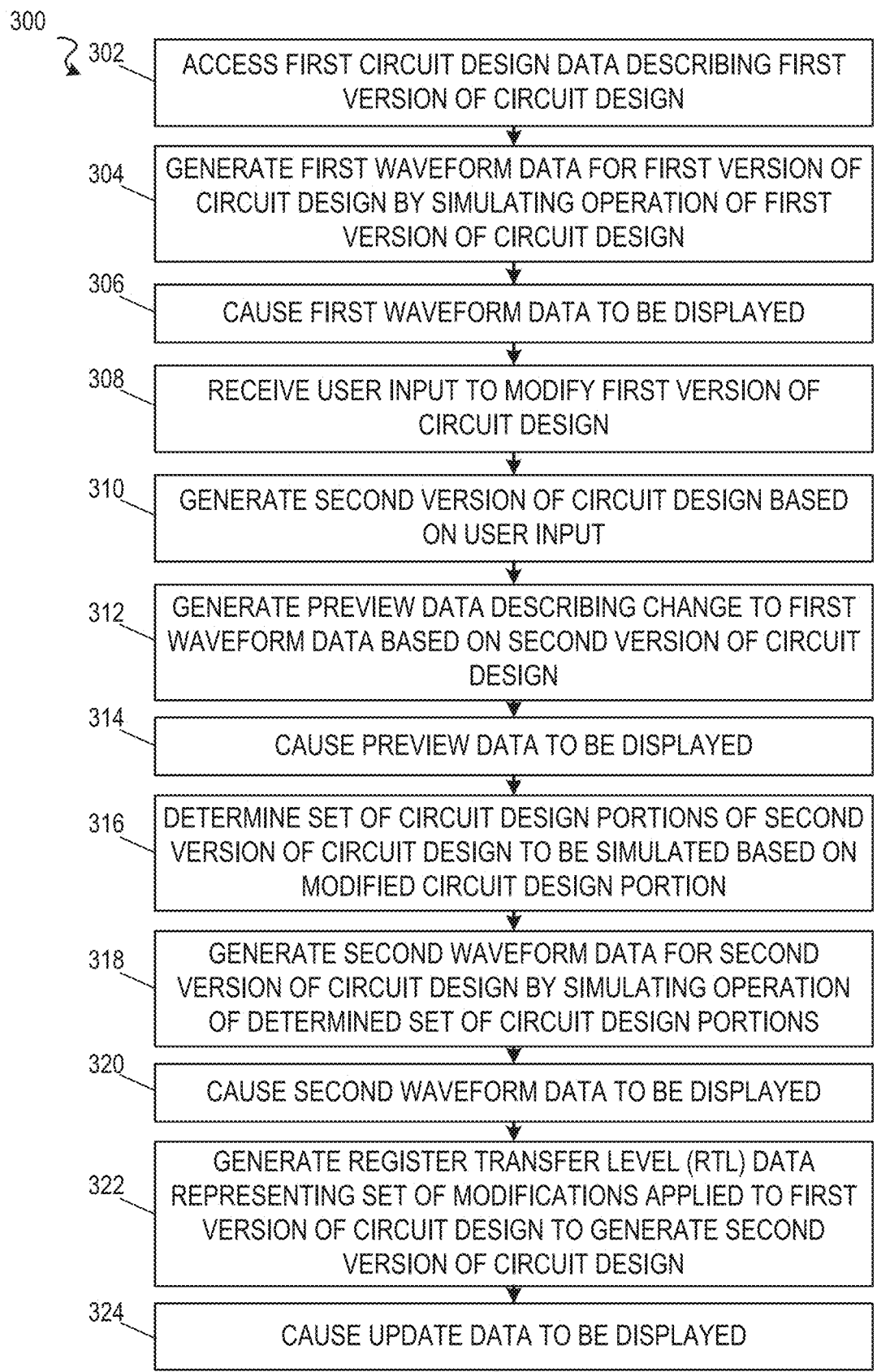

FIGS. 2 and 3 are flowcharts illustrating example methods for analyzing waveform data generated for simulated circuit design, according to some embodiments. It will be understood that example methods described herein may be performed by a device, such as a computing device executing instructions of an EDA software system, in accordance with some embodiments. Additionally, example methods described herein may be implemented in the form of executable instructions stored on a computer-readable medium or in the form of electronic circuitry. For instance, the operations of a method 200 of FIG. 2 may be represented by executable instructions that, when executed by a processor of a computing device, cause the computing device to perform the method 200. An operation of the method 200 (or another method described herein) may be performed by a hardware processor (e.g., central processing unit or graphics processing unit) of a computing device (e.g., desktop, server, etc.). Depending on the embodiment, an operation of an example method described herein may be repeated in different ways or involve intervening operations not shown. Though the operations of example methods may be depicted and described in a certain order, the order in which the operations are performed may vary among embodiments, including performing certain operations in parallel.

Referring now to the method 200 of FIG. 2, operation 202 generates first waveform data for a first version of the circuit design by simulating (e.g., fully simulating) operation of the first version of the circuit design. For some embodiments, the first waveform data describes a set of signals (e.g., waveform signals) generated by the first version of the circuit design during the simulated operation of the first version of the circuit design. Operation 202 can represent performance of a full simulation on the first version of the circuit design and, additionally, can represent the first time a full simulation is performed on the first version of the circuit design. The set of signals of the first waveform data can represent full-scale waveform signals.

Subsequently, operation 204 causes the first waveform data to be displayed (e.g., via a graphical user interface of an EDA software system (e.g., 600 of FIG. 6)). For some embodiments, the first waveform signal data comprises one or more signal values for one or more signals generated by the first version of the circuit design. A given signal value can be displayed in a signal graph that graphically presents the signal value over time. By displaying the first waveform data, operation 204 can enable a user to identify one or more signals that exhibit a problem (e.g., issue, error, incorrect result) in the first version of the circuit design.

The method 200 continues with operation 206 generating second circuit design data that describes a second version of the circuit design, where the second version of the circuit design comprises a modified circuit design portion that corresponds to a modification applied to the first version of the circuit design. For some embodiments, the modification applied to the first version of the circuit design is based on a user input (e.g., user input received by an EDA software system via a graphical user interface, such as graphical user interface 600 of FIG. 6). Accordingly, the modified portion can be generated based on the user input in view of the first circuit design data. For some embodiments, the modified circuit design portion comprises additional logic inserted into the first version of the circuit design to result in the second version of the circuit design. By way of user input, a user can insert the additional logic into the first version of the circuit design to address (e.g., resolve or fix) one or more signals identified by the user as exhibiting a problem (e.g., issue, error, incorrect result).

Thereafter, the method 200 continues with operation 208 determining a set of circuit design portions of the second version of the circuit design to be simulated based on the modified circuit design portion. For some embodiments, the determined set of circuit design portions comprises the modified circuit design portion of the second version of the circuit design (e.g., portion modified based on user input). Additionally, for some embodiments, the determined set of circuit design portions further comprises one or more other circuit design portions of the second version of the circuit design that receive (e.g., as an input signal) at least one signal generated by the modified circuit design portion (e.g., those portions having a cone of influence that includes a signal from the modified portion). Operation 208 can determine the set of circuit design portions of the second version of the circuit design by analyzing a cone of influence (COI) of the additional logic inserted based on a user's changes to the first version of the circuit design (to result in the second version of the circuit design), and analyzing those portions not in the COI of the property being tested or simulated. Additionally, those portions of the circuit design that are a fan-out of a target signal which is within the COI of the property being tested or simulated are included by the determined set of circuit design portions.

Operation 210 generates second waveform data by simulating operation of the set of circuit design portions determined by operation 208. For some embodiments, simulating the determined set of circuit design portions comprises reusing, from the first waveform data, a set of signal values (e.g., simulated values) associated with one or more circuit design portions of the circuit design not included by the determined set of circuit design portions. The one or more signal values generated for the determined set of circuit design portions are newly generated by operation 210. By simulating operation of the determined set of circuit design portions (which can comprise less than all of the circuit design), operation 210 can facilitate partial simulation of the circuit design, where signal values for only the determined set of operations are regenerated by operation 210. In this way, the partial simulation facilitated by operation 210 can be performed based on a determined/reduced set of logic (of the second version of the circuit design) that needs to be re-simulated in the COI of a property being tested or simulated. According to some embodiments, a partial simulation runs faster and with less memory compared to a full simulation.

Subsequently, operation 212 causes the second waveform data to be displayed (e.g., via a graphical user interface). For some embodiments, the second waveform signal data comprises one or more signal values for one or more signals generated by the second version of the circuit design. As described herein, a given signal value can be displayed in a signal graph that graphically presents the signal value over time.

Referring now to the method 300 of FIG. 3, operation 302 accesses first circuit design data that describes a first version of a circuit design. The first circuit design data can describe, for example, a netlist for the first version of the circuit design.

The method 300 continues with operations 304 and 306, which, according to various embodiments, are respectively similar to operations 202 and 204 of the method 200 described above with respect to FIG. 2.

Operation 308 receives (e.g., via a graphical user interface of an EDA software system) a user input to modify the first version of the circuit design. For example, the user input can be to modify the first version of the circuit design by inserting new or additional logic to the first version of the circuit design. Subsequently, operation 310 generates a second version of the circuit design based on the user input. For some embodiments, the second version of the circuit design is described by second circuit design data, which can be used in subsequent operations.

The method 300 continues with operation 312 generating, based on the second version of the circuit design data (e.g., described by second circuit design data), preview data that describes a change to the first waveform data based on the modified circuit design portion of the second version of the circuit design data. For some embodiments, the preview data comprises a set of signal values for signals generated by the modified portion. For example, the modified portion of the second version of the circuit design can comprise additional logic inserted into the first version of the circuit design to result in the second version of the circuit design, and the set of signal values of the preview data can represent new signals added to the circuit design by the insertion of the additional logic. Depending on the embodiment, the preview data generation can be limited to one or more signals affected by logic changes the user applied to the circuit design (e.g., the modification applied to a version of the circuit design based on a user input, such as user input received by an EDA software system via a graphical user interface).

Additionally, where the modified portion of the second version of the circuit design comprises additional logic inserted into the first version of the circuit design, generating the preview data can comprise calculating at least one signal generated by the additional logic based on a second set of signal values, from the first waveform data, associated with one or more signals received (e.g., as input signals) by the modified circuit design portion. In particular, the calculating can comprise applying simple logic (e.g., inversion, logical AND, logical XOR) to the second set of signal values to calculate the at least one signal, where applying the simple logic is performed without performing a simulation (e.g., partial or full) of any portion of the circuit design. The second set of signal values can represent prior signal values that are being reused by operation 312 to generate the preview data. According to some embodiments, applying the simple logic can be performed faster than performing a partial or full simulation of the modified portion of the circuit design. By applying simple logic to calculate the at least one signal rather than using a partial/full simulation process, some embodiments can enable a user to review the preview data prior to proceeding with the next performance of a simulation process. This can provide the user with the opportunity to modify the second version of the circuit design further (e.g., if the signal values of the preview data do not reflect the user's expectation). For some embodiments, operation 312 does not propagate the set of signal values of the preview data to any other portion of the second version of the circuit design. In this way, operation 312 can limit the preview provided by the preview data to the modified portion of the second version of the circuit design (e.g., user can see limited effects of signals of the additional logic inserted into the first version of the circuit design to result in the second version of the circuit design).

Thereafter, operation 314 causes the preview data to be displayed (e.g., via a graphical user interface of an EDA software system). For some embodiments, causing the preview data to be displayed comprises causing the first waveform data to be displayed with the preview data. Like waveform data, the preview data can be displayed in a signal graph that graphically presents the signal value over time. For various embodiments, operations 312 and 314 are performed prior to simulating operation of any portion of the second version of the circuit design. In this way, such embodiments can provide a user with a fast preview of the signal impact of their modification (e.g., signal value outputs from their inserted logic) prior to the next simulation being performed on the circuit design.

The method 300 continues with operations 316 through 320, which according to some embodiments, are respectively similar to operations 208 through 212 of the method 200 as described above with respect to FIG. 2.

Operation 322 generates register transfer level (RTL) data that represents a set of modifications applied to the first version of the circuit design to generate the second version of the circuit design. In particular, the RTL data can be generated based on the modified portion of the second version of the circuit design. According to various embodiments, the RTL data summarizes all the modifications (e.g., changes) the user applied to the first version of the circuit design to generate the second version of the circuit design.

Additionally, operation 324 causes update data to be displayed (e.g., via a graphical user interface of an EDA software system), where the update data can indicate a second set of signal values, in the second waveform data generated by operation 318, that is updated in comparison to the first waveform data generated by operation 304. For some embodiments, the update data describes a set of annotations to be displayed with respect to a graphical presentation of the second version of the circuit design. For example, the set of annotations can comprise highlighting a portion of a displayed schematic of the second version of the circuit design. In another example, the set of annotations can comprise highlighting of a portion of a list of signals associated with the second version of the circuit design (e.g., highlighting a portion of a schematic representing the second version of the circuit design). By operation 324, some embodiments can differentiate which portions of the second version of the circuit design are simulated again (e.g., by operation 318), and which portions of the second version of the circuit design are not (i.e., signal value results from a prior simulation run are reused or kept). Depending on the embodiment, the set of annotations can comprise a visual or graphical aid that is generated based the updated signals.

Figure 4:
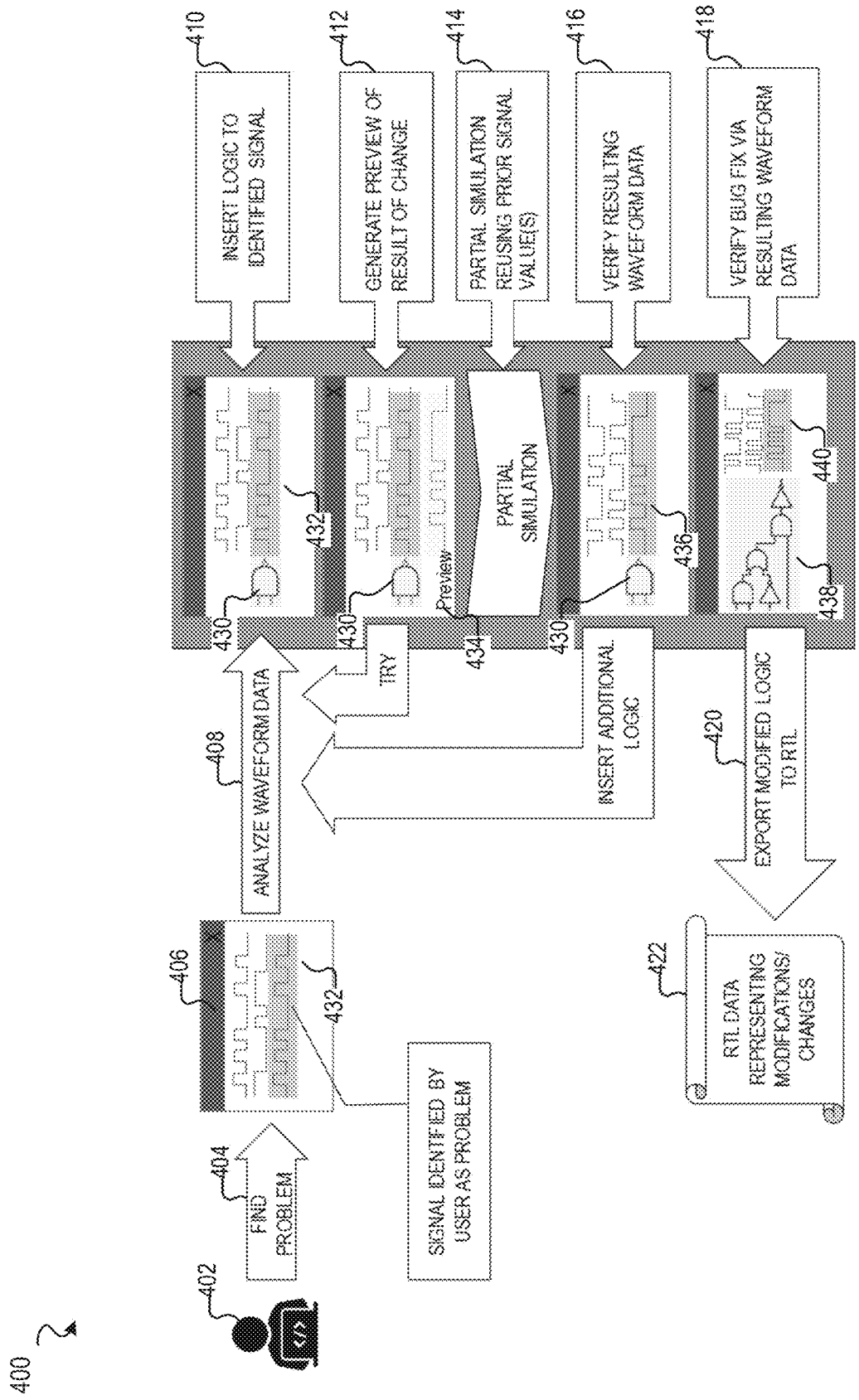
FIG. 4 illustrates an example process for debugging a circuit design by analyzing waveform data, according to some embodiments.

FIG. 4 illustrates an example process for debugging a circuit design by analyzing waveform data, according to some embodiments. As illustrated, a user 402 can attempt to find a problem (404) in a given circuit design by reviewing first waveform data displayed (406) via a graphical user interface. As described herein, the first waveform data can be generated by simulating (e.g., fully simulating) the given circuit design. Through the display of the first waveform data (406), the user can identify a signal that is exhibiting a problem in the circuit design. Upon analyzing the first waveform data (408), the user can determine additional logic to insert into the circuit design to potentially address the problem. The user causes (e.g., via user input) the insertion of additional logic (410) with respect to the identified signal. The additional logic is represented by logic element 430, and the output of the identified signal is represented by waveform signal graph 432. In response to inserting the additional logic, a preview (e.g., preview data) of the result of the change (e.g., insertion) is generated (412) and displayed. In particular, the generating the preview (e.g., preview data) can comprise generating the output of the signal of the additional logic inserted to the circuit design at 410. In FIG. 4, the preview is presented by a signal graph 434 of the output of the signal of the inserted additional logic. If the user is not satisfied with the output of the additional logic (e.g., as illustrated by the signal graph 434), the user can try another change (e.g., insertion of an alternative additional logic to the one tried) to the circuit design.

After reviewing the preview and being satisfied with the output of the additional logic, the user can cause a partial simulation to be performed (414), which can reuse one or more prior signal values of the first waveform data (generated by the full simulation). The partial simulation can result in second waveform data to be generated for the modified circuit design. The updated output of the identified signal, based on the influence of the additional logic, can be represented by a signal graph 436. The user can verify the (resulting) second waveform data (416). If the user determines that the second waveform data does not provide verification, the user can cause another insertion of additional logic to the circuit design. However, if the user determines that the second waveform data does provide verification, the user can verify whether the problem is fixed (418) by all the modifications applied (e.g., additional logic inserted) to the circuit design by the user. Elements 438 represent all the modifications applied (e.g., the final modified logic inserted) to the circuit design by the user to address the problem, and a signal graph 440 represents a signal output of the all the modifications (e.g., the final modified logic inserted). The final modified logic can represent multiple iterations of adding logic to the given circuit design. Eventually, the final modified logic can be exported (420) as RTL data 422, which represents all the modifications applied to the circuit design by the user.

Figure 5:
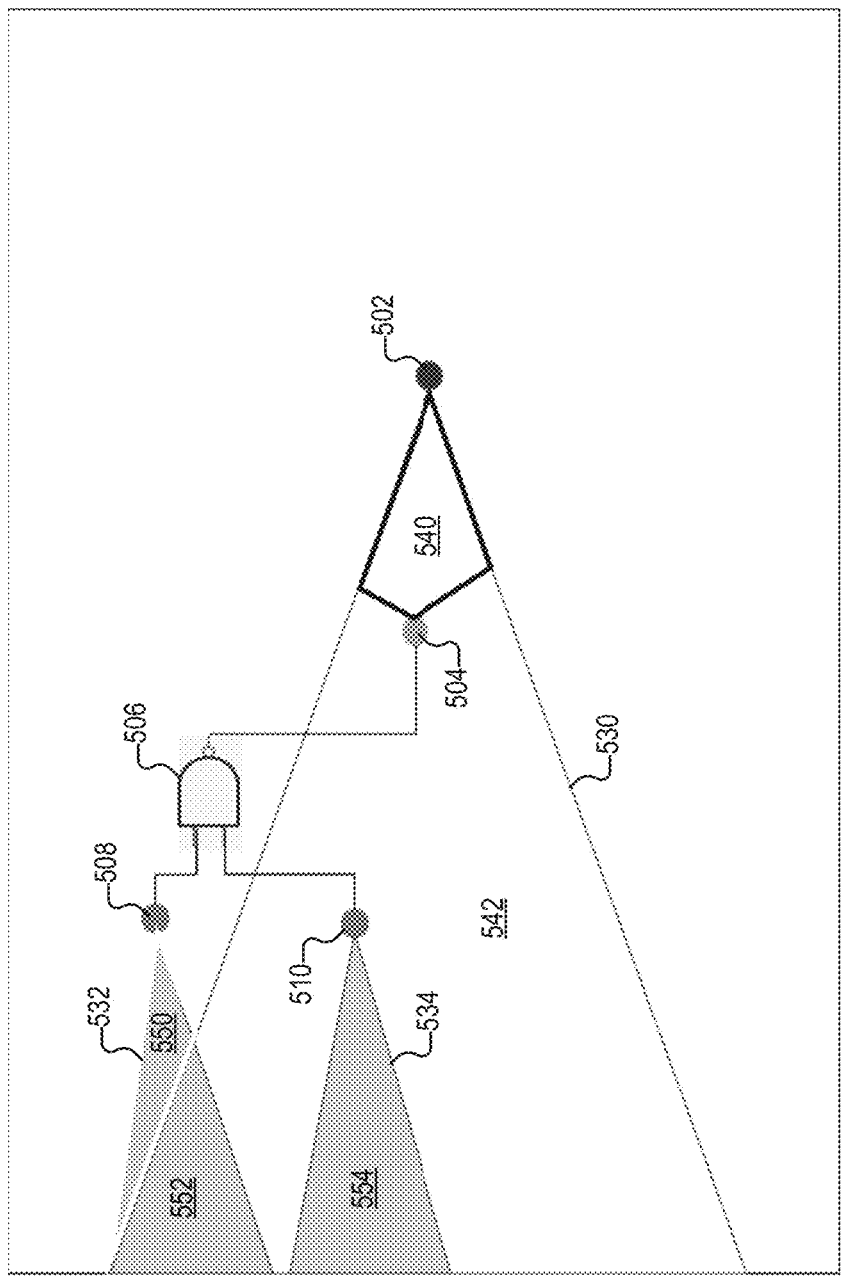
FIG. 5 is a diagram illustrating examples portions of circuit design that are simulated to generate waveform data, according to some embodiments.

FIG. 5 is a diagram illustrating examples portions of circuit design that are simulated to generate waveform data, according to some embodiments. In particular, property 502 represents a property of a given circuit design that a user is trying to test, where the property can represent any signal or logic of the given circuit design. Target signal 504 represents a signal that drives or otherwise determines a value of the property. According to some embodiments, the user attempts to insert additional logic to influence (e.g., output to) the target signal 504, which in turn can influence (e.g., determine value of) the property 502. Additional logic 506 represents additional logic inserted by a user, where the additional logic 506 comprises a first input signal 508, a second input signal 510, and an output signal that is received by the target signal 504. COI 530 represents a cone of influence of the property 502, COI 532 represents a cone of influence of the first input signal 508, and COI 534 represents a cone of influence of the second input signal 510. As used herein, a cone of influence of a given signal illustrates which portions of a circuit design influences the value of the given signal. According to some embodiments, based on insertion of the additional logic 506 to the given circuit design, the COI 530 of the property 502, the COI 532 of the first input signal 508, and the COI 534 of the second input signal 510 determine which portions of the given circuit design are simulated (e.g., during re-simulation or partially simulation) to generate second waveform data, as described herein. In particular, some embodiments determine that the set of portions to be simulated (e.g., during re-simulation or partial simulation) comprises: portions 550 and 552 of the COI 532; portion 554 of the COI 534; and portion 540 of the COI 530. In simulating portions 550, 552, 554, and 540, various embodiments can reuse signal values previously generated (e.g., previously generated by a prior full simulation run) for portion 542 of the COI 530 of the property, portion 552 of the COI 532, and portion 554 of COI 534. Accordingly, various embodiments would not include portion 542, portion 552, or portion 554 in the determined set of portions to be simulated (e.g., during re-simulation or partial simulation).

Figure 6:
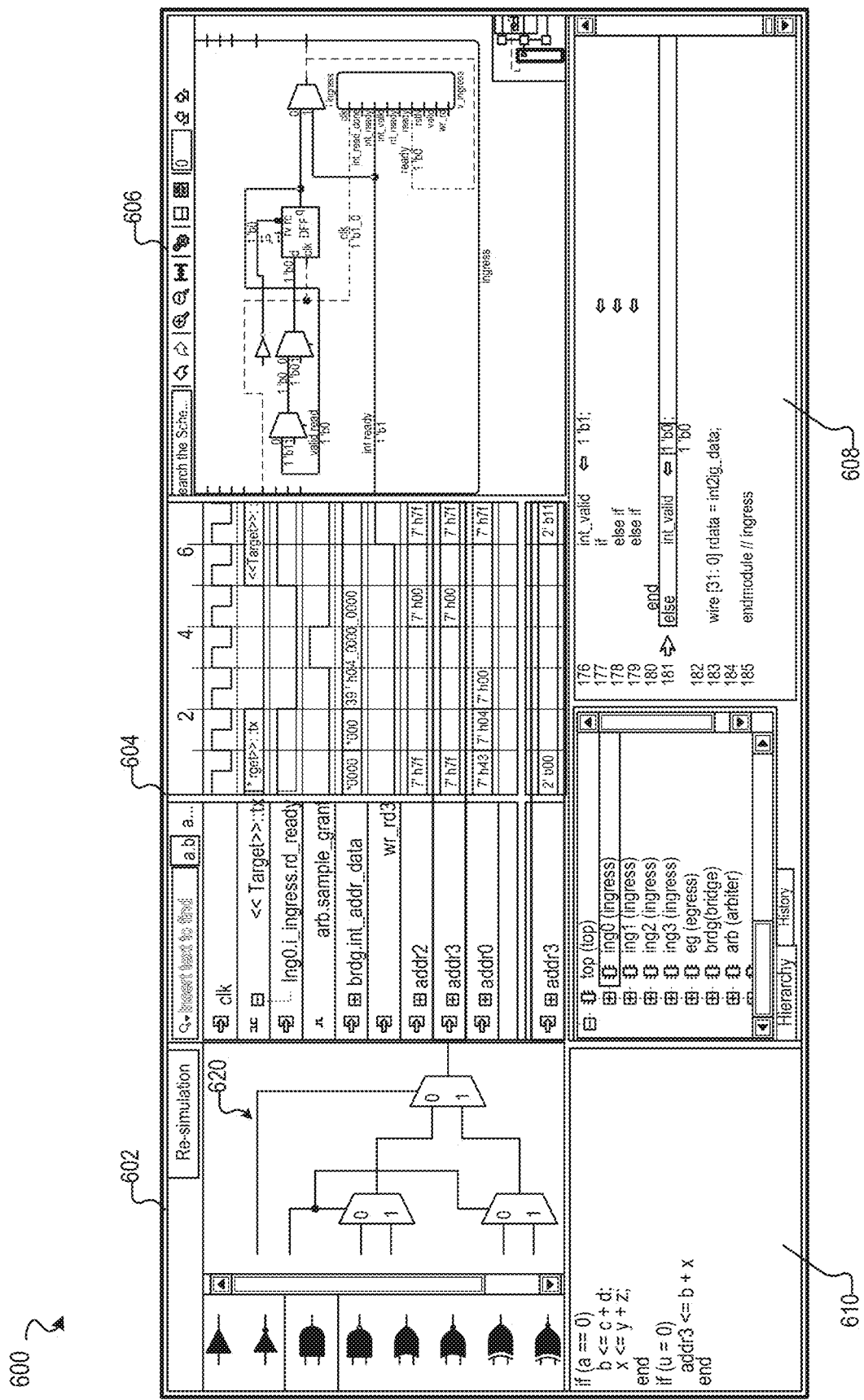
FIGS. 6 and 7 illustrate example graphical user interfaces that display waveform data, according to some embodiments.
Figure 7:
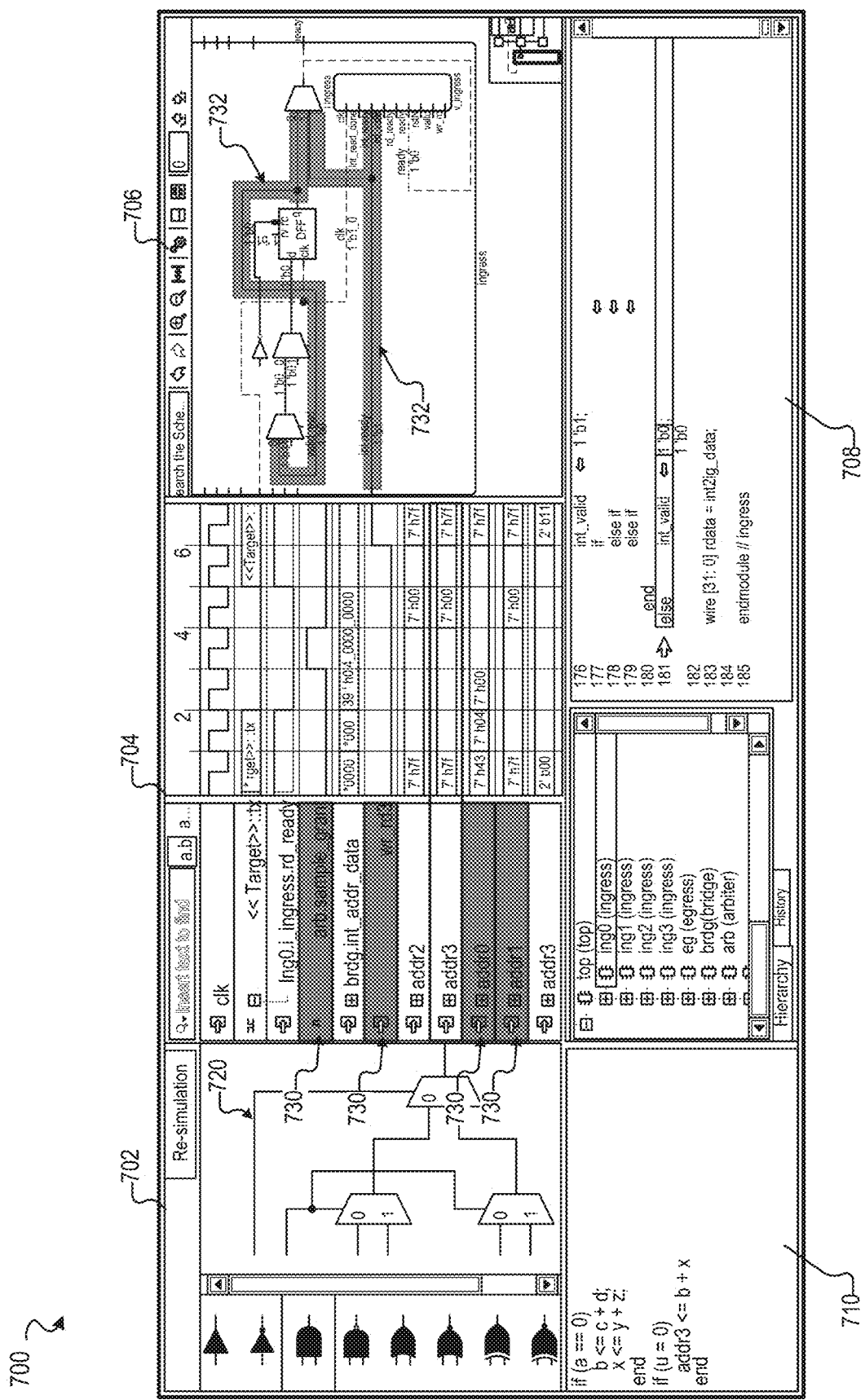

FIGS. 6 and 7 illustrate example graphical user interfaces 600, 700 that display waveform data, according to some embodiments. Each of the graphical user interfaces 600, 700 can be displayed by an EDA software system. In particular, the graphical user interface 600 comprises a logic compose area 602, a waveform data area 604, a circuit design schematic area 606, a source browser 608, and a logic expression area 610. According to some embodiments, a user can use the logic compose area 602 to compose (e.g., build) additional logic (e.g., via drag-and-drop logic elements), which the user can then insert (e.g., add) to a given circuit design to fix a problem (e.g., fix behavior of a target signal). A user can also use the logic compose area 602 to instruct re-simulation of the circuit design (e.g., after insertion of the additional logic) and update the waveform data displayed in the waveform data area 604. The waveform data area 604 can display a listing of signals of the given circuit design and waveform data (e.g., first waveform data or second waveform data) for those signals, where the waveform data can provide signal values for those signals. The circuit design schematic area 606 can present a schematic representation of the circuit design. Through the circuit design schematic area 606, a user can see the result of connection changes based on the insertion of additional logic to the circuit design. The source browser 608 can display RTL source code representing the current version of the circuit design. The logic expression area 610 can display an expression (e.g., RTL source code) representing the additional logic composed by the logic compose area 602.

Referring now to FIG. 7, similar to the graphical user interface 600 of FIG. 6, the graphical user interface 700 comprises a logic compose area 702, a waveform data area 704, a circuit design schematic area 706, a source browser 708, and a logic expression area 710. In particular, the graphical user interface 700 illustrates example annotations that can indicate updates to waveform data and signals based on insertion of additional logic to the circuit design. As shown, the example annotations can comprise highlights 730, 732. The highlights 730 indicate signals in the waveform data area 704 that have updated signal values as a result of the simulating (e.g., re-simulating) the circuit design after insertion of additional logic. The highlights 732 indicate portions of the circuit design associated with signals in the waveform data area 704 that have updated signal values as a result of the simulating (e.g., re-simulating) the circuit design after insertion of additional logic.

Figure 8:
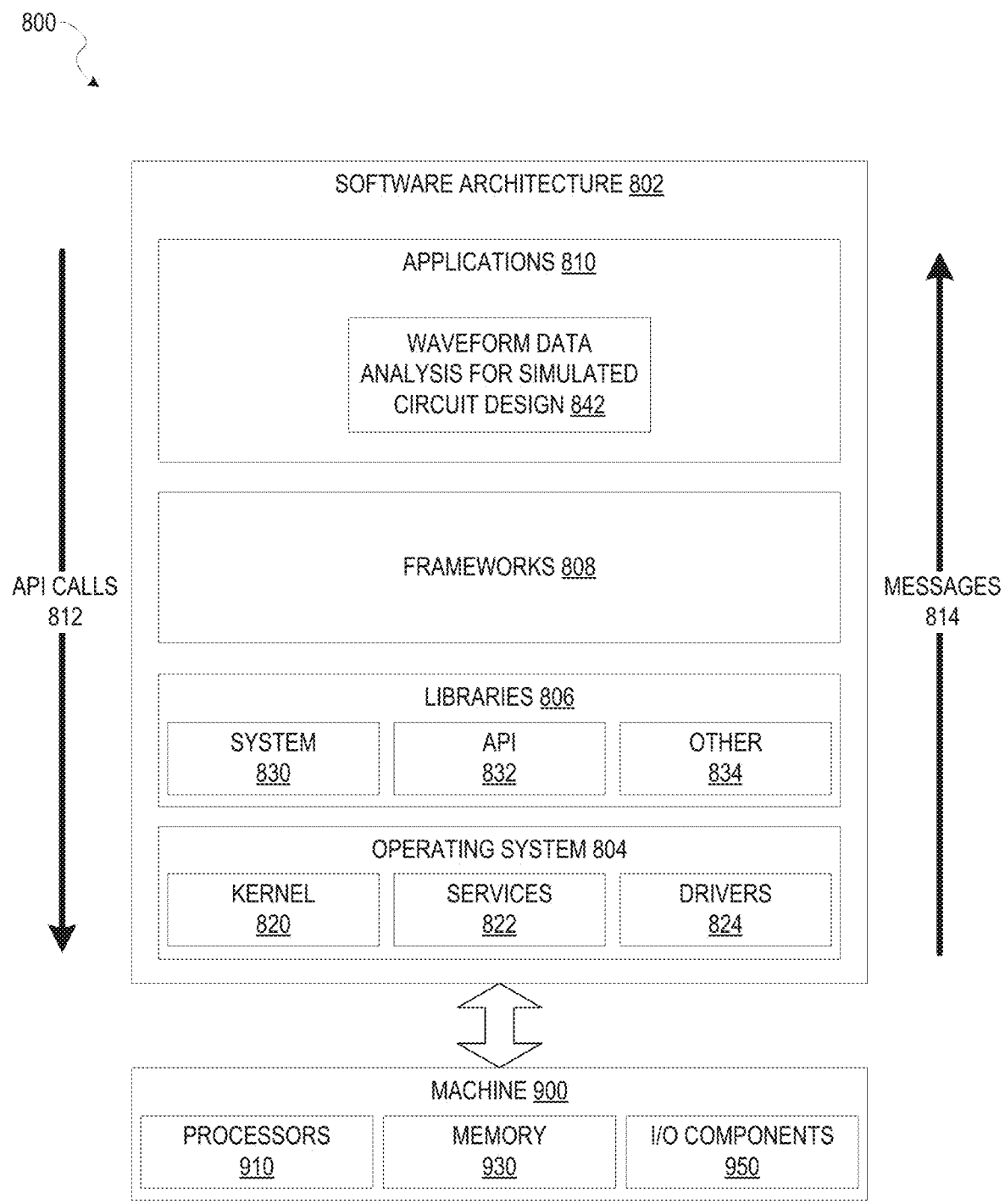
FIG. 8 is a block diagram illustrating an example of a software architecture that may be operating on an EDA computing device and may be used with methods for analyzing waveform data generated for simulated circuit design, according to some embodiments.

FIG. 8 is a block diagram 800 illustrating an example of a software architecture 802 that may be operating on an EDA computer and may be used with methods for analyzing waveform data generated for simulated circuit design, according to some embodiments. The software architecture 802 can be used as an EDA computing device to implement any of the methods described above. Aspects of the software architecture 802 may, in various embodiments, be used to store circuit designs, and to facilitate generation of a circuit design in an EDA environment, from which physical devices may be generated.

FIG. 8 is merely a non-limiting example of a software architecture 802, and it will be appreciated that many other architectures can be implemented to facilitate the functionality described herein. In various embodiments, the software architecture 802 is implemented by hardware such as a machine 900 of FIG. 9 that includes processors 910 (e.g., hardware processors), memory 930, and I/O components 950. In this example, the software architecture 802 can be conceptualized as a stack of layers where each layer may provide a particular functionality. For example, the software architecture 802 includes layers such as an operating system 804, libraries 806, software frameworks 808, and applications 810. Operationally, the applications 810 invoke application programming interface (API) calls 812 through the software stack and receive messages 814 in response to the API calls 812, consistent with some embodiments. In various embodiments, any client device, any server computer of a server system, or any other device described herein may operate using elements of the software architecture 802. An EDA computing device described herein may additionally be implemented using aspects of the software architecture 802, with the software architecture 802 adapted for operating to perform waveform data analysis in a manner described herein.

In some embodiments, an EDA application of the applications 810 performs waveform data analysis according to embodiments described herein using various modules within the software architecture 802. For example, in some embodiments, an EDA computing device similar to the machine 900 includes the memory 930 and the one or more processors 910. The processors 910 also implement a waveform data analysis for simulated circuit design module 842 for analyzing waveform data generated for a simulated circuit design, in accordance with various embodiments described herein.

In various other embodiments, rather than being implemented as modules of the one or more applications 810, the waveform data analysis for simulated circuit design module 842 may be implemented using elements of the libraries 806, the operating system 804, or the software frameworks 808.

In various implementations, the operating system 804 manages hardware resources and provides common services. The operating system 804 includes, for example, a kernel 820, services 822, and drivers 824. The kernel 820 acts as an abstraction layer between the hardware and the other software layers, consistent with some embodiments. For example, the kernel 820 provides memory management, processor management (e.g., scheduling), component management, networking, and security settings, among other functionality. The services 822 can provide other common services for the other software layers. The drivers 824 are responsible for controlling or interfacing with the underlying hardware, according to some embodiments. For instance, the drivers 824 can include display drivers, signal-processing drivers to optimize modeling computation, memory drivers, serial communication drivers (e.g., Universal Serial Bus (USB) drivers), WI-FI® drivers, audio drivers, power management drivers, and so forth.

In some embodiments, the libraries 806 provide a low-level common infrastructure utilized by the applications 810. The libraries 806 can include system libraries 830 such as libraries of blocks for use in an EDA environment or other libraries that can provide functions such as memory allocation functions, string manipulation functions, mathematic functions, and the like. In addition, the libraries 806 can include API libraries 832 such as media libraries (e.g., libraries to support presentation and manipulation of various media formats such as Joint Photographic Experts Group (JPEG or JPG), or Portable Network Graphics (PNG)), graphics libraries (e.g., an OpenGL framework used to render in two dimensions (2D) and three dimensions (3D) in a graphic context on a display), database libraries (e.g., SQLite to provide various relational database functions), web libraries (e.g., WebKit to provide web browsing functionality), and the like. The libraries 806 may also include other libraries 834.

The software frameworks 808 provide a high-level common infrastructure that can be utilized by the applications 810, according to some embodiments. For example, the software frameworks 808 provide various graphic user interface (GUI) functions, high-level resource management, high-level location services, and so forth. The software frameworks 808 can provide a broad spectrum of other APIs that can be utilized by the applications 810, some of which may be specific to a particular operating system 804 or platform. In various embodiments, the systems, methods, devices, and instructions described herein may use various files, macros, libraries, and other elements of an EDA design environment to implement waveform data analysis as described herein. This includes analysis of input design files for an integrated circuit design, along with any element of hierarchical analysis that may be used as part of or along with the embodiments described herein. While netlist files, library files, SDC files, and view definition files are examples that may operate within the software architecture 802, it will be apparent that other files and structures may provide a similar function, in various embodiments.

Certain embodiments are described herein as including logic or a number of components, modules, elements, or mechanisms. Such modules can constitute either software modules (e.g., code embodied on a machine-readable medium or in a transmission signal) or hardware modules. A "hardware module" is a tangible unit capable of performing certain operations and can be configured or arranged in a certain physical manner. In various embodiments, one or more computer systems (e.g., a standalone computer system, a client computer system, or a server computer system) or one or more hardware modules of a computer system (e.g., a processor or a group of processors) are configured by software (e.g., an application or application portion) as a hardware module that operates to perform certain operations as described herein.

In some embodiments, a hardware module is implemented mechanically, electronically, or any suitable combination thereof. For example, a hardware module can include dedicated circuitry or logic that is permanently configured to perform certain operations. For example, a hardware module can be a special-purpose processor, such as a field-programmable gate array (FPGA) or an application-specific integrated circuit (ASIC). A hardware module may also include programmable logic or circuitry that is temporarily configured by software to perform certain operations. For example, a hardware module can include software encompassed within a general-purpose processor or other programmable processor. It will be appreciated that the decision to implement a hardware module mechanically, in dedicated and permanently configured circuitry, or in temporarily configured circuitry (e.g., configured by software) can be driven by cost and time considerations.

Accordingly, the phrase "module" should be understood to encompass a tangible entity, be that an entity that is physically constructed, permanently configured (e.g., hardwired), or temporarily configured (e.g., programmed) to operate in a certain manner or to perform certain operations described herein. Considering embodiments in which hardware modules are temporarily configured (e.g., programmed), each of the hardware modules need not be configured or instantiated at any one instance in time. For example, where a hardware module comprises a general-purpose processor configured by software to become a special-purpose processor, the general-purpose processor may be configured as respectively different special-purpose processors (e.g., comprising different hardware modules) at different times. Software can accordingly configure a particular processor or processors, for example, to constitute a particular hardware module at one instance of time and to constitute a different hardware module at a different instance of time.

Hardware modules can provide information to, and receive information from, other hardware modules. Accordingly, the described hardware modules can be regarded as being communicatively coupled. Where multiple hardware modules exist contemporaneously, communications can be achieved through signal transmission (e.g., over appropriate circuits and buses) between or among two or more of the hardware modules. In embodiments in which multiple hardware modules are configured or instantiated at different times, communications between or among such hardware modules may be achieved, for example, through the storage and retrieval of information in memory structures to which the multiple hardware modules have access. For example, one hardware module performs an operation and stores the output of that operation in a memory device to which it is communicatively coupled. A further hardware module can then, at a later time, access the memory device to retrieve and process the stored output. Hardware modules can also initiate communications with input or output devices, and can operate on a resource (e.g., a collection of information).

The various operations of example methods described herein can be performed, at least partially, by one or more processors that are temporarily configured (e.g., by software) or permanently configured to perform the relevant operations. Whether temporarily or permanently configured, such processors constitute processor-implemented modules that operate to perform one or more operations or functions described herein. As used herein, "processor-implemented module" refers to a hardware module implemented using one or more processors.

Similarly, the methods described herein can be at least partially processor-implemented, with a particular processor or processors being an example of hardware. For example, at least some of the operations of a method can be performed by one or more processors or processor-implemented modules. Moreover, the one or more processors may also operate to support performance of the relevant operations in a "cloud computing" environment or as a "software as a service" (SaaS). For example, at least some of the operations may be performed by a group of computers (as examples of machines 900 including processors 910), with these operations being accessible via a network (e.g., the Internet) and via one or more appropriate interfaces (e.g., an API). In certain embodiments, for example, a client device may relay or operate in communication with cloud computing systems, and may access circuit design information in a cloud environment.

The performance of certain of the operations may be distributed among the processors, not only residing within a single machine 900, but deployed across a number of machines 900. In some embodiments, the processors 910 or processor-implemented modules are located in a single geographic location (e.g., within a home environment, an office environment, or a server farm). In some other embodiments, the processors or processor-implemented modules are distributed across a number of geographic locations.

Figure 9:
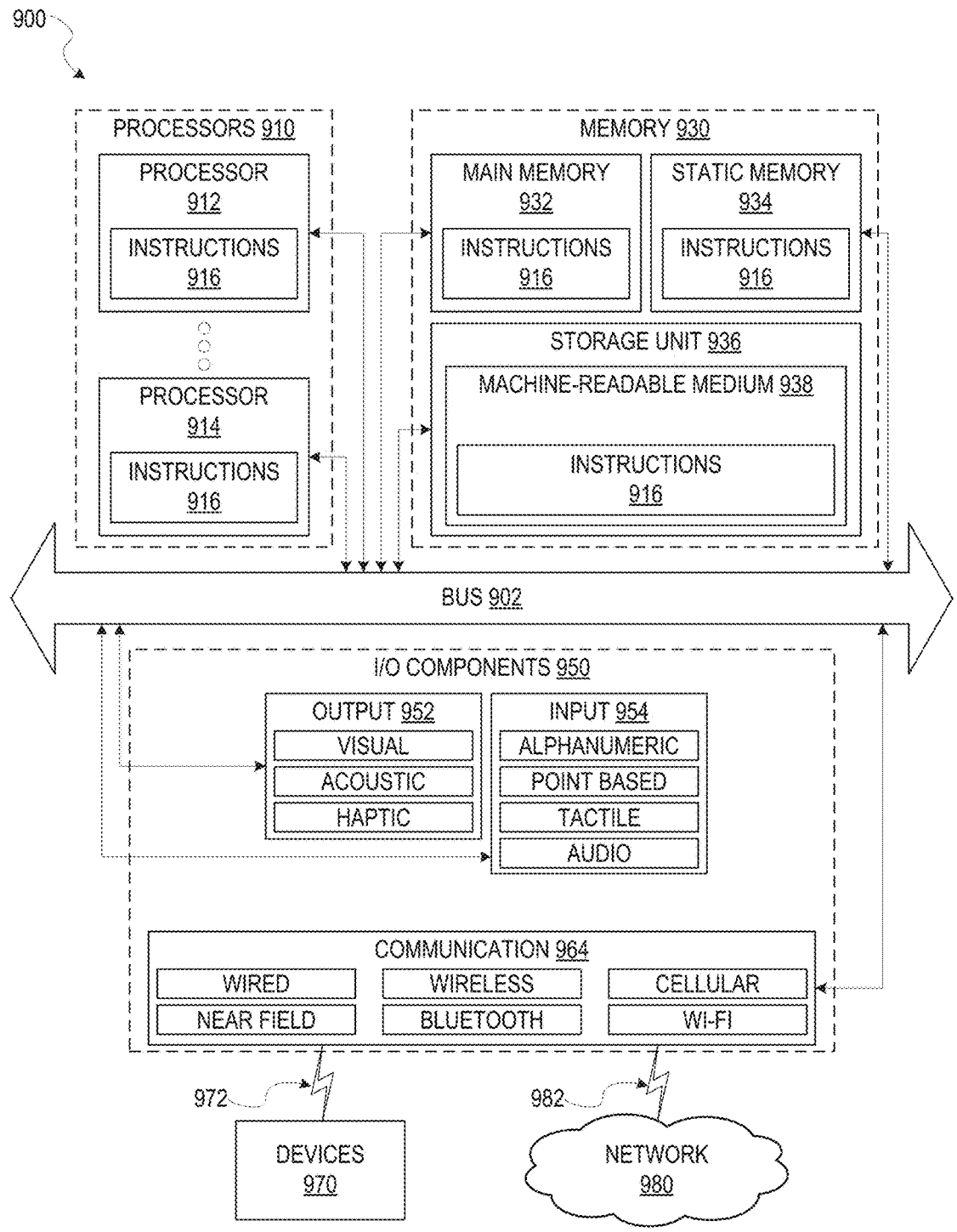
FIG. 9 is a diagram representing a machine in the form of a computer system within which a set of instructions is executed, causing the machine to perform any one or more of the methods discussed herein, according to some embodiments.

FIG. 9 is a diagrammatic representation of the machine 900 in the form of a computer system within which a set of instructions may be executed for causing the machine 900 to perform any one or more of the methodologies discussed herein, according to some embodiments. FIG. 9 shows components of the machine 900, which is, according to some embodiments, able to read instructions from a machine-readable medium (e.g., a machine-readable storage medium) and perform any one or more of the methodologies discussed herein. Specifically, FIG. 9 shows a diagrammatic representation of the machine 900 in the example form of a computer system, within which instructions 916 (e.g., software, a program, an application, an applet, an app, or other executable code) for causing the machine 900 to perform any one or more of the methodologies discussed herein can be executed. In alternative embodiments, the machine 900 operates as a standalone device or can be coupled (e.g., networked) to other machines. In a networked deployment, the machine 900 may operate in the capacity of a server machine or a client machine in a server-client network environment, or as a peer machine in a peer-to-peer (or distributed) network environment. The machine 900 can comprise, but not be limited to, a server computer, a client computer, a personal computer (PC), a tablet computer, a laptop computer, a netbook, or any machine capable of executing the instructions 916, sequentially or otherwise, that specify actions to be taken by the machine 900. Further, while only a single machine 900 is illustrated, the term "machine" shall also be taken to include a collection of machines 900 that individually or jointly execute the instructions 916 to perform any one or more of the methodologies discussed herein.

In various embodiments, the machine 900 comprises processors 910, memory 930, and I/O components 950, which can be configured to communicate with each other via a bus 902. In some embodiments, the processors 910 (e.g., a central processing unit (CPU), a reduced instruction set computing (RISC) processor, a complex instruction set computing (CISC) processor, a graphics processing unit (GPU), a digital signal processor (DSP), an ASIC, a radio-frequency integrated circuit (RFIC), another processor, or any suitable combination thereof) include, for example, a processor 912 and a processor 914 that may execute the instructions 916. The term "processor" is intended to include multi-core processors 910 that may comprise two or more independent processors 912, 914 (also referred to as "cores") that can execute the instructions 916 contemporaneously. Although FIG. 9 shows multiple processors 910, the machine 900 may include a single processor 912 with a single core, a single processor 912 with multiple cores (e.g., a multi-core processor 912), multiple processors 910 with a single core, multiple processors 910 with multiple cores, or any combination thereof.

The memory 930 comprises a main memory 932, a static memory 934, and a storage unit 936 accessible to the processors 910 via the bus 902, according to some embodiments. The storage unit 936 can include a machine-readable medium 938 on which are stored the instructions 916 embodying any one or more of the methodologies or functions described herein. The instructions 916 can also reside, completely or at least partially, within the main memory 932, within the static memory 934, within at least one of the processors 910 (e.g., within the processor's cache memory), or any suitable combination thereof, during execution thereof by the machine 900. Accordingly, in various embodiments, the main memory 932, the static memory 934, and the processors 910 are considered machine-readable media 938.

As used herein, the term "memory" refers to a machine-readable medium 938 able to store data temporarily or permanently and may be taken to include, but not be limited to, random-access memory (RAM), read-only memory (ROM), buffer memory, flash memory, and cache memory. While the machine-readable medium 938 is shown, in some embodiments, to be a single medium, the term "machine-readable medium" should be taken to include a single medium or multiple media (e.g., a centralized or distributed database, or associated caches and servers) able to store the instructions 916. The term "machine-readable medium" shall also be taken to include any medium, or combination of multiple media, that is capable of storing instructions (e.g., the instructions 916) for execution by a machine (e.g., the machine 900), such that the instructions, when executed by one or more processors of the machine (e.g., the processors 910), cause the machine to perform any one or more of the methodologies described herein. Accordingly, a "machine-readable medium" refers to a single storage apparatus or device, as well as "cloud-based" storage systems or storage networks that include multiple storage apparatus or devices. The term "machine-readable medium" shall accordingly be taken to include, but not be limited to, one or more data repositories in the form of a solid-state memory (e.g., flash memory), an optical medium, a magnetic medium, other non-volatile memory (e.g., erasable programmable read-only memory (EPROM)), or any suitable combination thereof. The term "machine-readable medium" specifically excludes non-statutory signals per se.

The I/O components 950 include a wide variety of components to receive input, provide output, produce output, transmit information, exchange information, capture measurements, and so on. In general, it will be appreciated that the I/O components 950 can include many other components that are not shown in FIG. 9. The I/O components 950 are grouped according to functionality merely for simplifying the following discussion, and the grouping is in no way limiting. In various embodiments, the I/O components 950 include output components 952 and input components 954. The output components 952 include visual components (e.g., a display such as a plasma display panel (PDP), a light emitting diode (LED) display, a liquid crystal display (LCD), a projector, or a cathode ray tube (CRT)), acoustic components (e.g., speakers), haptic components (e.g., a vibratory motor), other signal generators, and so forth. The input components 954 include alphanumeric input components (e.g., a keyboard, a touch screen configured to receive alphanumeric input, a photo-optical keyboard, or other alphanumeric input components), point-based input components (e.g., a mouse, a touchpad, a trackball, or other pointing instruments), tactile input components (e.g., a physical button, a touch screen that provides location and force of touches or touch gestures, or other tactile input components), audio input components (e.g., a microphone), and the like.

In some embodiments, outputs from an EDA computing device may include design documents, files for additional steps in a design flow, or outputs for circuit fabrication. As described herein, "constraints," "requirements," "design elements," and other aspects of a circuit design refer to selectable values that are set as part of the design of a circuit. Such design constraints, requirements, or elements may be adjusted by a system operator or circuit designer to suit the particular goals of a project or circuit that results from the operations described herein.

Communication can be implemented using a wide variety of technologies. The I/O components 950 may include communication components 964 operable to couple the machine 900 to a network 980 or devices 970 via a coupling 982 and a coupling 972, respectively. For example, the communication components 964 include a network interface component or another suitable device to interface with the network 980. In further examples, the communication components 964 include wired communication components, wireless communication components, cellular communication components, near field communication (NFC) components, BLUETOOTH® components (e.g., BLUETOOTH® Low Energy), WI-FI® components, and other communication components to provide communication via other modalities. The devices 970 may be another machine or any of a wide variety of peripheral devices (e.g., a peripheral device coupled via a USB).

In various embodiments, one or more portions of the network 980 can be an ad hoc network, an intranet, an extranet, a virtual private network (VPN), a local area network (LAN), a wireless LAN (WLAN), a wide area network (WAN), a wireless WAN (WWAN), a metropolitan area network (MAN), the Internet, a portion of the Internet, a portion of the public switched telephone network (PSTN), a plain old telephone service (POTS) network, a cellular telephone network, a wireless network, a WI-FI® network, another type of network, or a combination of two or more such networks. For example, the network 980 or a portion of the network 980 may include a wireless or cellular network, and the coupling 982 may be a Code Division Multiple Access (CDMA) connection, a Global System for Mobile communications (GSM) connection, or another type of cellular or wireless coupling.

Furthermore, the machine-readable medium 938 is non-transitory (in other words, not having any transitory signals) in that it does not embody a propagating signal. However, labeling the machine-readable medium 938 "non-transitory" should not be construed to mean that the machine-readable medium 938 is incapable of movement; the machine-readable medium 938 should be considered as being transportable from one physical location to another. Additionally, since the machine-readable medium 938 is tangible, the machine-readable medium 938 may be considered to be a machine-readable device.

Throughout this specification, plural instances may implement components, operations, or structures described as a single instance. Although individual operations of one or more methods are illustrated and described as separate operations, one or more of the individual operations may be performed concurrently, and nothing requires that the operations be performed in the order illustrated.

Structures and functionality presented as separate components in example configurations may be implemented as a combined structure or component.

Similarly, structures and functionality presented as a single component may be implemented as separate components. These and other variations, modifications, additions, and improvements fall within the scope of the subject matter herein.

Although an overview of the inventive subject matter has been described with reference to some embodiments, various modifications and changes may be made to these embodiments without departing from the broader scope of embodiments of the present disclosure.

The embodiments illustrated herein are described in sufficient detail to enable those skilled in the art to practice the teachings disclosed. Other embodiments may be used and derived therefrom, such that structural and logical substitutions and changes may be made without departing from the scope of this disclosure. The detailed description, therefore, is not to be taken in a limiting sense, and the scope of various embodiments is defined only by the appended claims, along with the full range of equivalents to which such claims are entitled.

As used herein, the term "or" may be construed in either an inclusive or exclusive sense. The terms "a" or "an" should be read as meaning "at least one," "one or more," or the like. The use of words and phrases such as "one or more," "at least," "but not limited to," or other like phrases shall not be read to mean that the narrower case is intended or required in instances where such broadening phrases may be absent.

Boundaries between various resources, operations, modules, engines, and data stores are somewhat arbitrary, and particular operations are illustrated in a context of specific illustrative configurations. Other allocations of functionality are envisioned and may fall within a scope of various embodiments of the present disclosure. In general, structures and functionality presented as separate resources in the example configurations may be implemented as a combined structure or resource. Similarly, structures and functionality presented as a single resource may be implemented as separate resources. These and other variations, modifications, additions, and improvements fall within a scope of embodiments of the present disclosure as represented by the appended claims. The specification and drawings are, accordingly, to be regarded in an illustrative rather than a restrictive sense.

The description above includes systems, methods, devices, instructions, and computer media (e.g., computing machine program products) that embody illustrative embodiments of the disclosure. In the description, for the purposes of explanation, numerous specific details are set forth in order to provide an understanding of various embodiments of the inventive subject matter. It will be evident, however, to those skilled in the art, that embodiments of the inventive subject matter may be practiced without these specific details. In general, well-known instruction instances, protocols, structures, and techniques are not necessarily shown in detail.

What is claimed is:

1. A method comprising:
    accessing, by a hardware processor, first circuit design data that describes a first version of a circuit design;
    generating, by the hardware processor, first waveform data by using an electronic automation software to simulate operation of the first version of the circuit design based on the first circuit design data, the first waveform data describing a set of signals generated by the first version of the circuit design during the simulated operation of the first version of the circuit design;
    causing, by the hardware processor, the first waveform data to be displayed;
    generating, by the hardware processor and based on the first circuit design data, second circuit design data that describes a second version of the circuit design, the second version of the circuit design comprising a modified circuit design portion that corresponds to a modification applied to the first version of the circuit design;
    determining, by the hardware processor, a set of circuit design portions of the second version of the circuit design to be simulated based on the modified circuit design portion, the determined set of circuit design portions comprising the modified circuit design portion, the determined set of circuit design portions further comprising another circuit design portion of the second version of the circuit design that receives at least one signal generated by the modified circuit design portion;
    generating, by the hardware processor, second waveform data by using the electronic automation software to simulate operation of the determined set of circuit design portions, the simulating the determined set of circuit design portions comprising reusing, from the first waveform data, a set of signal values associated with one or more circuit design portions of the circuit design not included by the determined set of circuit design portions;
    causing, by the hardware processor, the second waveform data to be displayed on a graphical user interface of the electronic automation software; and
    generating, by the hardware processor, register transfer level (RTL) data that represents a set of modifications applied to the first version of the circuit design to generate the second version of the circuit design.

2. The method of claim 1, wherein the generating the second circuit design data based on the first circuit design data comprises:
    generating the modified circuit design portion based on the first circuit design data and a user input.

3. The method of claim 1, wherein the modified circuit design portion comprises additional logic inserted into the first version of the circuit design to result in the second version of the circuit design.

4. The method of claim 1, further comprising:
    generating, by the hardware processor and based on the second circuit design data, preview data that describes a change to the first waveform data based on the modified circuit design portion.

5. The method of claim 4, wherein the modified circuit design portion comprises additional logic inserted into the first version of the circuit design to result in the second version of the circuit design, and wherein the generating the preview data that describes the change to the first waveform data based on the modified circuit design portion comprises:
    calculating at least one signal generated by the additional logic based on a second set of signal values, from the first waveform data, associated with one or more signals received by the modified circuit design portion.

6. The method of claim 4, further comprising:
    causing, by the hardware processor, the first waveform data to be displayed on the graphical user interface of the electronic automation software with the preview data.

7. The method of claim 6, wherein the generating the preview data is performed prior to the generating the second waveform data.

8. The method of claim 1, further comprising:
    after the generating the second waveform data, causing, by the hardware processor, update data to be displayed on the graphical user interface of the electronic automation software, the update data indicating a second set of signal values, in the second waveform data, that is updated in comparison to the first waveform data.

9. The method of claim 8, wherein the update data describes a set of annotations to be displayed, on the graphical user interface of the electronic automation software, with respect to a graphical presentation of the second version of the circuit design.

10. The method of claim 9, wherein the set of annotations comprises highlighting a portion of a schematic of the second version of the circuit design displayed on the graphical user interface of the electronic automation software.

11. The method of claim 9, wherein the set of annotations comprises highlighting of a portion of a list of signals associated with the second version of the circuit design.

12. A device comprising:
    a memory storing instructions; and
    a hardware processor communicatively coupled to the memory and configured by the instructions to perform operations comprising:
        accessing first circuit design data that describes a first version of a circuit design;
        generating first waveform data by using an electronic automation software to simulate operation of the first version of the circuit design based on the first circuit design data, the first waveform data describing a set of signals generated by the first version of the circuit design during the simulated operation of the first version of the circuit design;
        causing the first waveform data to be displayed;
        receiving user input to modify the first version of the circuit design;
        generating, based on the first circuit design data and the user input, second circuit design data that describes a second version of the circuit design, the second version of the circuit design comprising a modified circuit design portion that corresponds to a modification applied to the first version of the circuit design based on the user input; and prior to simulating operation of any portion of the second version of the circuit design:

generating, based on the second circuit design data, preview data that describes a change to the first waveform data based on the modified circuit design portion;

causing the preview data to be displayed on a graphical user interface of the electronic automation software; and generating register transfer level (RTL) data that represents a set of modifications applied to the first version of the circuit design to generate the second version of the circuit design.

13. The device of claim 12, wherein the modified circuit design portion comprises additional logic inserted into the first version of the circuit design, and wherein the generating the preview data that describes the change to the first waveform data based on the modified circuit design portion comprises:

calculating at least one signal generated by the additional logic based on a set of signal values, from the first waveform data, associated with one or more signals received by the modified circuit design portion.

14. The device of claim 12, wherein the causing the preview data to be displayed comprises:

causing the first waveform data to be displayed with the preview data.

15. The device of claim 12, wherein the modified circuit design portion comprises additional logic inserted into the first version of the circuit design.

16. The device of claim 12, wherein the operations further comprise:

determining a set of circuit design portions of the second version of the circuit design to be simulated based on the modified circuit design portion, the determined set of circuit design portions comprising the modified circuit design portion, the determined set of circuit design portions further comprising another circuit design portion of the second version of the circuit design that receives at least one signal generated by the modified circuit design portion;

generating second waveform data by using the electronic automation software to simulate operation of the determined set of circuit design portions, the simulating the determined set of circuit design portions comprising reusing, from the first waveform data, a set of signal values associated with one or more circuit design portions of the circuit design not included by the determined set of circuit design portions; and causing the second waveform data to be displayed.

17. The device of claim 16, further comprising:

after the generating the second waveform data, causing update data to be displayed, the update data indicating a second set of signal values updated in comparison to the first waveform data.

18. A non-transitory computer-readable medium comprising instructions that, when executed by a hardware processor of a device, cause the device to perform operations comprising:

generating first waveform data for a first version of a circuit design by using an electronic automation software to simulate operation of the first version of the circuit design, the first waveform data describing a set of signals generated by the first version of the circuit design during the simulated operation of the first version of the circuit design;

causing the first waveform data to be displayed;

generating circuit design data that describes a second version of the circuit design, the second version of the circuit design comprising a modified circuit design portion that corresponds to a modification applied to the first version of the circuit design;

determining a set of circuit design portions of the second version of the circuit design to be simulated based on the modified circuit design portion, the determined set of circuit design portions comprising the modified circuit design portion, the determined set of circuit design portions further comprising another circuit design portion of the second version of the circuit design that receives at least one signal generated by the modified circuit design portion;

generating second waveform data by using the electronic automation software to simulate operation of the determined set of circuit design portions, the simulating the determined set of circuit design portions comprising reusing, from the first waveform data, a set of signal values associated with one or more circuit design portions of the circuit design not included by the determined set of circuit design portions;

causing the second waveform data to be displayed on a graphical user interface of the electronic automation software; and generating register transfer level (RTL) data that represents a set of modifications applied to the first version of the circuit design to generate the second version of the circuit design.

19. The non-transitory computer-readable medium of claim 18, wherein the modified circuit design portion comprises additional logic inserted into the first version of the circuit design to result in the second version of the circuit design.

20. The non-transitory computer-readable medium of claim 18, wherein the operations comprise:

after the generating the second waveform data, causing, by the hardware processor, update data to be displayed on the graphical user interface of the electronic automation software, the update data indicating a second set of signal values, in the second waveform data, that is updated in comparison to the first waveform data.

* * * * *